United States Patent [19]
Walenta et al.

[11] Patent Number: 5,786,098
[45] Date of Patent: Jul. 28, 1998

[54] IRON OXIDE COATED LOW ALLOY STEEL SUBSTRATE FOR IMPROVED BOUNDARY LUBRICATION

[75] Inventors: John B. Walenta; Chuong Q. Dam, both of Peoria, Ill.

[73] Assignee: Caterpillar Inc., Peoria, Ill.

[21] Appl. No.: 723,441

[22] Filed: Oct. 7, 1996

[51] Int. Cl.$^6$ .................................................. B32B 9/00
[52] U.S. Cl. .................................................. 428/469
[58] Field of Search .................................................. 428/469

[56] References Cited

U.S. PATENT DOCUMENTS 3,896,903  7/1975  Takimoto .................................. 184/99

FOREIGN PATENT DOCUMENTS 7259638  3/1994  Japan.

Primary Examiner—Terressa Mosley
Attorney, Agent, or Firm—Pankaj M. Khosla

[57] ABSTRACT

A process for increasing the boundary lubrication of low alloy steel lubricated contacts includes providing a low alloy steel part having a non-oxidized steel substrate. An iron oxide film is formed on the substrate by low temperature arc vapor deposition and the resulting iron oxide coated low alloy steel part has greater boundary lubrication than the non-oxidized low alloy steel part.

21 Claims, 1 Drawing Sheet

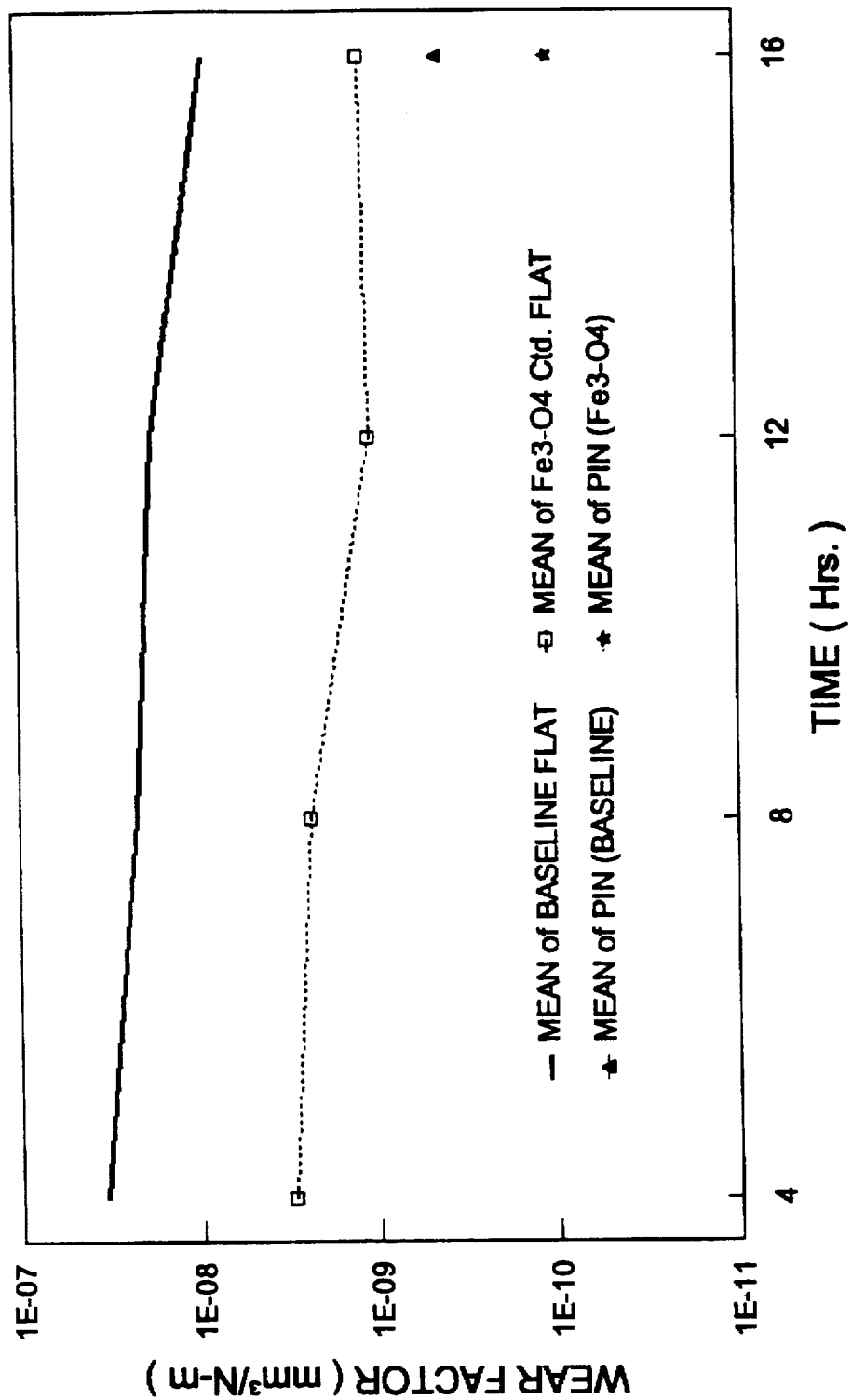

IRON OXIDE COATED LOW ALLOY STEEL SUBSTRATE FOR IMPROVED BOUNDARY LUBRICATION

TECHNICAL FIELD

The present invention relates generally to a process for increasing the boundary lubrication of lubricated low alloy steel contacts, and more particularly to a process for increasing the boundary lubrication of low alloy steel contacts by forming an $Fe_3O_4$ film on the low alloy steel substrate.

BACKGROUND ART

It has been recognized by researchers in the field of oil lubricated contacts, such as gears and rollers, that the boundary lubrication of oil lubricated steel contacts is enhanced by the presence of an iron oxide ($Fe_3O_4$) film on the steel surface. It has been theorized that in oil lubricated contacts, the long molecule chains in the lubricating oil have a tendency to bond to iron through chemisorbtion with the $Fe_3O_4$ film on the surface of the steel substrate, thereby resulting in contact surfaces having a lower coefficient of friction.

Typically, the formation of an $Fe_3O_4$ film on a steel substrate is accomplished by the process of steam oxidation, which occurs at high temperatures, ordinarily at about 1000° F. or greater. While the formation of $Fe_3O_4$ film by steam oxidation is found to be tolerable by high alloy steels, it is known that steam oxidation is not suitable for low alloy steels because the high temperature tempers the low alloy steel to a very low hardness. This problem is also complicated when the low alloy grade steel part has been carburized and case hardened. For example, a hardened low alloy steel has a tempering temperature of about 300° F. Exposing such a part to a temperature of about 1000° F., as encountered during steam oxidation, reduces the surface hardness of the steel part, which in turn, detrimentally lowers the contact fatigue strength and pitting resistance of the part. For example, a hardened low alloy steel part having a Rockwell 'C' Hardness of $R_c$ 59 will temper back to a hardness in the range of $R_c$ 20 to $R_c$ 35 after being exposed to temperatures in excess of about 1000° F.

High alloy steels are typically used for making gears and rolling/sliding contacts parts for the aviation industry, such as in helicopter gearboxes, for example. High alloy steels, or even tool grade steels are employed in the aviation industry to enable engine and transmission components to withstand high temperatures due to an inadvertent loss of oil lubrication, and be able to run "dry" for limited periods of time without catastrophic failures. However, in the automotive, construction equipment and earthmoving equipment industry (generally referred to as ground vehicles industry), low alloy steels are generally used for making gears and other components for transmissions and engines.

It has long been desirable by the ground vehicle industry to have a process for improving the boundary lubrication of low alloy steels parts. It has been even more desirable to have a process for improving the boundary lubrication of low alloy steels parts by using the beneficial effects of $Fe_3O_4$ film formation. It has been very desirable to accomplish the above objectives without detrimentally tempering the low alloy steel part.

The present invention is directed to overcome one or more problems as set forth above.

DISCLOSURE OF THE INVENTION

In one aspect of the present invention, a process for increasing the boundary lubrication of low alloy steel lubricated contacts is disclosed. The process comprises the following steps. A low alloy steel part having a non-oxidized steel substrate is provided. An iron oxide film is formed on the substrate by low temperature arc vapor deposition. An iron oxide coated low alloy steel part having greater boundary lubrication than the non-oxidized low alloy steel part is formed.

In another aspect of the present invention, a low alloy steel article having improved boundary lubrication characteristics is disclosed. The article comprises a substrate and an iron oxide coating deposited on the substrate. The coating has a thickness no greater than about 5 μm. The iron oxide coated low alloy steel substrate has a Rockwell hardness no more than 5 $R_c$ points less that the Rockwell hardness of a non-oxidized low alloy steel substrate. The iron oxide coated low alloy steel substrate further has a wear factor at least 500% greater than the wear factor of a non-oxidized low alloy steel substrate.

BRIEF DESCRIPTION OF THE DRAWINGS

FIG. 1 is a graphical representation of the enhanced boundary lubrication characteristics of an iron oxide coated low alloy steel of the present invention and a comparison between the wear factors of coated and non-coated steel substrates, showing that an $Fe_3O_4$ coated low alloy steel has about a 1000% reduction in wear than a non-coated low alloy steel.

BEST MODE FOR CARRYING OUT THE INVENTION

In the preferred embodiment of the present invention, a process for increasing the boundary lubrication of low alloy steel lubricated contacts comprises the step of providing a low alloy steel part having a non-oxidized steel substrate. Desirably, the low alloy steel part has a surface hardness in the range of about 39 Rockwell 'C' to about 59 Rockwell 'C'. Preferably, the low alloy steel part has a surface hardened by case carburization. It is desirable to provide a low alloy steel part because the intended application is in making components that are subjected to lubricated contacts such as gears and transmissions of ground vehicles and a low alloy steel part is preferred from an economic standpoint. The low alloy steel part desirably has a non-oxidized steel substrate which has been cleaned and prepared for being able to bond with an iron oxide film. The cleaning and the preparation of the steel substrate can be accomplished by conventional methods such as degreasing, grit blasting, etching, chemically assisted vibratory techniques and the like. Such surface finishing techniques are well known to those skilled in the art.

In the preferred embodiment, the process further comprises the step of forming an iron oxide film on the substrate by low temperature arc vapor deposition. The preferred iron oxide is $Fe_3O_4$ because it results in improved boundary lubrication without a substantial increase in the friction coefficient of the lubricated contact. Low temperature arc vapor deposition (LTAVD) is the preferred method of depositing the iron oxide on the low alloy steel substrate because the LTAVD process is carried out at temperatures in the range of 150°–250° F. which are below the tempering temperature of typical low alloy grade steels.

In the preferred embodiment, the process further includes forming an iron oxide coated low alloy steel part which has greater boundary lubrication than the non-oxidized low alloy steel part. The term "boundary lubrication" as used herein, and in the claims, is defined as a condition of lubrication in which the friction and wear between two surfaces in relative motion are determined by the properties of the surfaces and by the properties of the lubricant other than bulk viscosity. Boundary lubrication is therefore a lubrication which is between dry sliding and elasto-hydrodynamic lubrication, in that, a fluid film is present but it is not sufficiently thick to prevent contact between the higher asperities in the contacting surfaces. In order to reduce the effects of this asperity contact and to enhance lubrication, an oil film of low sheer strength is interposed between the sliding surfaces. Therefore, oils intended for boundary lubrication contain additives which deposit such oil films on the contact surfaces. The most common type of additive used is the aliphatic fatty acid of the general formula $C_nH_{2n-1}COOH$, for example, stearic acid. The deposition of the iron oxide coating on the steel substrate aids in the bonding of the acid groups of these aliphatic fatty acid molecules with the surface metal atoms to form a strongly bonded oil film on the steel contact surfaces, thereby providing a very effective barrier to metal/metal contact.

In the preferred embodiment, the low alloy steel part, after being coated with the iron oxide coating, has a Rockwell hardness desirably no more than 5 Rockwell 'C' points less than the Rockwell hardness of the non-oxidized, non-coated low alloy steel part. Preferably, the iron oxide coated low alloy steel part has a Rockwell hardness no more than 2 Rockwell 'C' points less than the Rockwell hardness of the non-oxidized, non-coated low alloy steel part.

In the preferred embodiment, the low alloy steel part, after being coated with the iron oxide coating, has a wear factor at least 500% greater than the wear factor of the non-oxidized, non-coated low alloy steel part, and preferably has a wear factor at least 750% greater.

The term "wear factor" as used herein is as defined in Example A in this specification.

The term "low alloy" as used herein means a steel grade in which the hardenability elements, such as manganese, chromium, molybdenum and nickel, collectively constitute less than about 3.5% by weight of the total steel composition.

In the preferred embodiment, the iron oxide coated low alloy steel part desirably has a friction coefficient no more than about 20% greater than the friction coefficient of the non-oxidized, non-coated low alloy steel part, and preferably has a friction coefficient no more than about 16% greater. It is desirable that the friction coefficient be no more than about 20% greater because the beneficial effects of enhanced boundary lubrication will be offset by a substantial increase in the friction coefficient.

In the preferred embodiment, the iron oxide film has a thickness desirably no greater than about 5 µm and preferably has a thickness less than about 1 µm. An iron oxide coating thickness greater than about 5 µm is undesirable because the coating may develop residual stresses high enough to separate the coating from the substrate.

In another embodiment of the present invention, a low alloy steel article having improved boundary lubrication characteristics comprises a substrate. An iron oxide coating is deposited on the substrate. Desirably, the coating is of a thickness no greater than about 5 µm, and preferably a thickness less than about 1 µm. An iron oxide coating thickness greater than about 5 µm is undesirable because the coating may have residual stresses high enough to separate it from the substrate. The iron oxide coated low alloy steel substrate has a Rockwell hardness desirably no more than 5 Rockwell 'C' points less than the Rockwell hardness of a non-oxidized, non-coated low alloy steel substrate. The iron oxide coated low alloy steel substrate has a wear factor at least 500% greater than the wear factor of a non-oxidized, non-coated low alloy steel substrate.

The illustrative example, as set forth below, shows the beneficial effect of the iron oxide coating deposited by low temperature arc vapor deposition on a low alloy gear steel.

EXAMPLE A

The following test procedure was used to evaluate the differences between the wear factors of a iron oxide coated low alloy steel substrate and a non-coated steel substrate of a similar low alloy steel. The equipment used to carry out this test was a Cameron-Plint TE77 high frequency friction machine. The equipment consisted of a reciprocating pin on a fixed flat. The geometric contact between the pin and fixed flat was a line with an approximate Hertzian contact stress of about 0.57 gpa. The reciprocating test specimen was a through hardened AISI 52100 steel pin having the dimensions of 4.76 mm in diameter and 10 mm in length. This steel pin was made to slide against a fixed steel flat having the dimensions 25.4 mm wide, 25.4 mm long and 4 mm thick.

The steel pin (AISI grade 52100) pin was formed from an alloy steel having the following composition, by weight percent:

| | |
|---|---|
| carbon | 0.98 to 1.10; |
| manganese | 0.25 to 0.45; |
| phosphorus | 0.025 max.; |
| sulfur | 0.010 to 0.025; |
| silicon | 0.15 to 0.35; |
| chromium | 1.30 to 1.60; |
| copper | 0.35 max.; |
| nickel | 0.25 max.; |
| molybdenum | 0.08 max.; and |
| iron | balance. |

The steel flat was formed from a low alloy steel having the following composition, by weight percent:

| | |
|---|---|
| carbon | 0.19 to 0.23; |
| manganese | 0.90 to 1.10; |
| phosphorus | 0.020 max.; |
| sulfur | 0.015 to 0.025; |
| silicon | 0.08 max.; |
| chromium | 0.85 to 1.00; |
| copper | 0.10 max.; |
| nickel | 0.10 max.; |
| molybdenum | 0.40 to 0.45; |
| titanium | 0.020 max.; |
| aluminum | 0.020 min.; and |
| iron | balance. |

The steel flat formed from a low alloy grade steel, having the above composition, had a microstructure of martensite, spheroidal carbides and austenite, and had an average hardness of 41 Rockwell 'C'. The hardness of the reciprocating pin was about 62 Rockwell 'C'.

Sample 1 represents a non-coated steel flat sliding against a hardened steel pin and Sample 2 represents a steel flat coated with iron oxide ($Fe_3O_4$) coating by LTAVD process, and sliding against a similar hardened steel pin.

To evaluate the amount of wear of materials, the as-machined surface conditions were established by taking three surface profiles parallel to the sliding direction and three surface profiles perpendicular to the sliding direction before beginning the test for each of samples 1 and 2. After the completion of the test to determine the amount of wear, the above-mentioned surface profiles were taken again for each of samples 1 and 2. Each of the respective three profiles were averaged and the average value was multiplied by the contact width to determine the wear volume for the flat material. The wear measurement for the pin specimen was calculated using similar methodology. The wear test was run for four-hour test periods and the wear area on the flat specimen was measured after each of the four-hour test periods.

The wear factor was calculated by dividing the volumetric loss of materials in cubic millimeters ($mm^3$) by the product of the load in Newtons (N) and the linear sliding distance in meters (m), i.e., the wear factor had the units $mm^3/N\text{-}m$. The contact line was 10 mm long and the stroke length was 4.64 mm. The lubricant selected for this test was a 30 weight (30 W) drive train oil. The lubricant was continuously delivered to the contact interface at a rate of about 13 ml/hr or about one drop every 10 seconds. The pin was loaded to 225 Newtons for the duration of the test and the sliding speed of the pin over the flat was approximately 0.46 m/sec. The test was run for a total time of 16 hours divided evenly into four (4), 4-hour segments and the wear area of the flat specimen was measured after each 4-hour segment, and the pin surface wear was measured after 16 hours. It was calculated that the total linear sliding distance in each 16-hour test was approximately 26.55 km. A total of twenty wear tests were performed for each of sample 1 and sample 2 and the corresponding wear trends are the averages of those tests, as shown in FIG. 1.

Referring now to FIG. 1, it can be seen that the sample 1, i.e., the non-coated steel flat as shown by the solid line, exhibited a wear factor in the range of about $10 \times 10^{-9}$ $mm^3/N\text{-}m$ to about $50 \times 10^{-9}$ $mm^3/N\text{-}m$ when measured over a period of 16 hours. In stark contrast, sample 2, i.e., the $Fe_3O_4$ coated steel flat as shown by the dotted line, exhibited a wear factor in the range of about $1 \times 10^{-9}$ $mm^3/N\text{-}m$ to about $5 \times 10^{-9}$ $mm^3/N\text{-}m$ when measured over a period of 16 hours. Thus, sample 1 exhibited about 10 times greater a wear factor than sample 2, or in other words, sample 2 exhibited about a 1000% improvement in wear resistance as compared to sample 1. The friction coefficients for both sample 1 and sample 2 above were about 0.15 and it was determined that sample 2 exhibited only about 16% higher friction coefficient than sample 1.

Referring once again to FIG. 1, the steel pin sliding against sample 1, as shown by the solid triangle symbol, exhibited a wear factor of about $0.7 \times 10^{-9}$ $mm^3/N\text{-}m$ when measured at the end of a 16-hour test segment. In comparison, a similar steel pin sliding against sample 2, as shown by the solid asterix symbol, exhibited a wear factor of about $0.1 \times 10^{-9}$ $mm^3/N\text{-}m$ when similarly measured at the end of a 16-hour test segment. Thus, the steel pin sliding against sample 2 exhibited about a 700% improvement in wear resistance as compared to a steel pin sliding against sample 1.

Preferably, the $Fe_3O_4$ coating is deposited by an arc vapor deposition process which comprises the following steps. An arc source is provided. An oxygen gas source is provided. The arc source is adapted to impart a positive charge on the oxygen vapors generated. A negative bias voltage of about 50 volts is applied to the non-oxidized steel substrate by a voltage source. A low temperature arc vapor deposition (LTAVD) coating of iron oxide is deposited on the steel substrate. Such LTAVD coating methods are well known to those skilled in the art of physical vapor deposition techniques and will not be discussed further for purposes of brevity.

Industrial Applicability

The present invention is particularly useful for forming low alloy grade steel gears having enhanced boundary lubrication properties and significantly improved wear resistance. Such gears are used in the gearboxes and transmissions in ground vehicle applications for the automotive and construction and earthmoving industry.

Other aspects, objects and advantages of this invention can be obtained from a study of the disclosure, the drawing and the appended claims.

We claim:

1. A process for increasing the boundary lubrication of low alloy steel lubricated contacts, comprising the steps of:

providing a low alloy steel part having a non-oxidized steel substrate;

forming an iron oxide film on said substrate by low temperature arc vapor deposition; and forming an iron oxide coated low alloy steel part having greater boundary lubrication than said non-oxidized low alloy steel part.

2. A process, as set forth in claim 1, wherein said iron oxide coated low alloy steel part has a Rockwell hardness no more than 5 $R_c$ points less that the Rockwell hardness of said non-oxidized low alloy steel part.

3. A process, as set forth in claim 2, wherein said iron oxide coated low alloy steel part has a Rockwell hardness no more than 2 $R_c$ points less that the Rockwell hardness of said non-oxidized low alloy steel part.

4. A process, as set forth in claim 3, wherein said iron oxide coated low alloy steel part has a Rockwell hardness equal to the Rockwell hardness of said non-oxidized low alloy steel part.

5. A process, as set forth in claim 1, wherein said iron oxide coated low alloy steel part has a wear factor at least 500% greater than the wear factor of said non-oxidized low alloy steel part.

6. A process, as set forth in claim 2, wherein said iron oxide coated low alloy steel part has a wear factor at least 500% greater than the wear factor of said non-oxidized low alloy steel part.

7. A process, as set forth in claim 1, wherein said iron oxide coated low alloy steel part has a coefficient of friction no more than about 20% greater than the coefficient of friction of said non-oxidized low alloy steel part.

8. A process, as set forth in claim 6, wherein said iron oxide coated low alloy steel part has a coefficient of friction no more than about 16% greater than the coefficient of friction of said non-oxidized low alloy steel part.

9. A process, as set forth in claim 1, wherein said iron oxide film has a thickness no greater than about 5 µm.

10. A process, as set forth in claim 8, wherein said iron oxide film has a thickness less than about 1 µm.

11. A process, as set forth in claim 1, including using oxygen gas for forming said iron oxide film by low temperature arc vapor deposition.

12. A process, as set forth in claim 1, including providing a low alloy steel part having a hardened surface by case carburization.

13. A low alloy steel article having improved boundary lubrication characteristics, comprising:

a substrate;

an iron oxide coating deposited on said substrate, said coating having a thickness no greater than about 5 µm;

said iron oxide coated low alloy steel substrate having a Rockwell hardness no more than 5 $R_c$ points less that the Rockwell hardness of a non-oxidized low alloy steel substrate; and said iron oxide coated low alloy steel substrate having a wear factor at least 500% greater than the wear factor of a non-oxidized low alloy steel substrate.

14. An article, as set forth in claim 13, wherein said iron oxide coated low alloy steel substrate has a Rockwell hardness no more than 2 $R_c$ points less that the Rockwell hardness of said non-oxidized low alloy steel substrate.

15. An article, as set forth in claim 14, wherein said iron oxide coated low alloy steel substrate has a Rockwell hardness equal to the Rockwell hardness of said non-oxidized low alloy steel substrate.

16. An article, as set forth in claim 13, wherein said iron oxide coated low alloy steel substrate has a wear factor at least 750% greater than the wear factor of said non-oxidized low alloy steel substrate.

17. An article, as set forth in claim 13, wherein said iron oxide coated low alloy steel substrate has a coefficient of friction no more than about 20% greater than the coefficient of friction of said non-oxidized low alloy steel substrate.

18. An article, as set forth in claim 17, wherein said iron oxide coated low alloy steel substrate has a coefficient of friction no more than about 16% greater than the coefficient of friction of said non-oxidized low alloy steel substrate.

19. An article, as set forth in claim 13, wherein said iron oxide coating has a thickness less than about 1 µm.

20. An article, as set forth in claim 13, wherein said iron oxide coated steel substrate has a wear factor in the range of about $1.5 \times 10^{-7}$ mm$^3$/N-m to about $1.0 \times 10^{-8}$ mm$^3$/N-m.

21. An article, as set forth in claim 13, wherein said iron oxide coated low alloy steel article is a case hardened gear.

* * * * *